United States Patent [19]

Konya

[11] Patent Number: 5,422,293
[45] Date of Patent: Jun. 6, 1995

[54] METHOD FOR MANUFACTURING A TFT PANEL

[75] Inventor: Naohiro Konya, Hino, Japan

[73] Assignee: Casio Computer Co., Ltd., Tokyo, Japan

[21] Appl. No.: 993,036

[22] Filed: Dec. 18, 1992

[30] Foreign Application Priority Data

Dec. 24, 1991 [JP] Japan .................. 3-355634
Dec. 24, 1991 [JP] Japan .................. 3-355635

[51] Int. Cl.⁶ .................. H01L 21/84; H01L 21/98
[52] U.S. Cl. .................. 437/50; 437/51; 437/60; 437/235; 437/248; 437/983; 437/195; 148/DIG. 117
[58] Field of Search .................. 437/51, 50, 181, 205, 437/206, 983; 148/DIG. 117, DIG. 118; 359/54, 59, 57

[56] References Cited

U.S. PATENT DOCUMENTS

| | | | |
|---|---|---|---|
| 4,871,234 | 10/1989 | Suzuki .................. | 437/181 |
| 5,028,122 | 7/1991 | Hamada et al. .................. | 359/54 |
| 5,086,009 | 2/1992 | Sangouard .................. | 359/54 |
| 5,128,786 | 7/1992 | Yanagisawa .................. | 359/54 |
| 5,146,301 | 9/1992 | Yamamura et al. .................. | 359/59 |
| 5,162,901 | 11/1992 | Shimada et al. .................. | 359/54 |

FOREIGN PATENT DOCUMENTS

| | | | |
|---|---|---|---|
| 53-145568 | 12/1978 | Japan .................. | 437/206 |
| 3215834 | 9/1981 | Japan .................. | 437/51 |
| 02210420 | 8/1990 | Japan . | |
| 02216129 | 8/1990 | Japan . | |
| 0364735 | 3/1991 | Japan .................. | 359/54 |
| 9102999 | 3/1991 | WIPO .................. | 437/51 |

Primary Examiner—Brian E. Hearn
Assistant Examiner—Michael Trinh
Attorney, Agent, or Firm—Frishauf, Holtz, Goodman & Woodward

[57] ABSTRACT

A TFT panel is manufactured by a process of forming an oxide voltage-apply lines, gate lines, and capacitor lines on an insulating substrate, and a process of forming thin-film transistors, pixel electrodes, data lines, and ground lines. In a state that one end of the gate line and both ends of the capacitor line are connected to the oxide voltage-apply line, oxide films are formed on the surfaces of the gate line and the capacitor line by anodization. After forming the oxide film, the gate line and the capacitor line are electrically separated from the oxide voltage-apply line.

8 Claims, 12 Drawing Sheets

METHOD FOR MANUFACTURING A TFT PANEL

BACKGROUND OF THE INVENTION

1. Field of the Invention

The present invention relates to a method for manufacturing a thin-film transistor panel for use in an active matrix liquid crystal display device.

2. Description of the Related Art

A thin-film transistor panel (hereinafter called TFT panel) for used in an active matrix liquid crystal display device comprises a plurality of gate lines, plurality of thin-film transistors arranged to correspond to crossing points of these lines, and pixel electrodes connected to the plurality of thin-film transistors and arranged in a matrix form, which are formed on a transparent substrate, e.g., glass. An inverse stagger structure is used as a thin-film transistor.

More specifically, as shown in FIG. 16, the above conventional TFT panel is so constructed that a plurality of gate lines GL, a plurality of data lines DL, a plurality of thin-film transistors 2 of inverse stagger type, and a plurality of pixel electrodes 6 are formed on a transparent substrate 1 made of glass.

The thin-film transistors 2 of stagger type are structured such that the gate lines GL formed on the substrate 1 are used as gate electrodes, an i-type semiconductor layer is formed on a gate insulating film 3 covering the gate electrodes, and source and drain electrodes are formed on the i-type semiconductor layer 5 through an n-type semiconductor layer.

The gate insulating film 3 of the thin-film transistor 2 covers the gate lines GL, and is formed on the entire surface of the substrate 1. The gate insulating film 3 is a transparent film made of SiN (silicon nitride). The pixel electrodes 6 are formed on the gate insulating film 3. The pixel electrodes 6 are formed of a transparent conductive film made of ITO and the like, and one end of the respective pixel electrodes 6 is connected to the source electrode of the respective thin-film transistors 2.

The respective thin-film transistors 2 are covered with a protection insulating film 7, which is formed on the entire surface of the gate insulating film 3 and which is made of SiN. The respective data lines DL are formed on the protection insulating film 7. Each of data lines DL is electrically connected to the drain electrode of the thin-film transistor 2 through a contact hole formed in the film 7. It is noted that an opening through which each of the pixel electrodes 6 is exposed is formed in the protection insulating film 7.

Moreover, one end of each of the gate lines GL and one end of each of the data lines DL are led to the outside of a display area A (display area of the liquid crystal display device) in an outline shown by a two-dotted chain line. A large wide gate line terminal GLa is formed in a lead-through end of the respective gate lines GL, and a large wide data line terminal DLa is formed in a lead-through end of the respective data lines DL.

In the above-mentioned TFT panel, the terminals GLa of all gate lines GL are formed in the same side. In a TFT panel in which the number of gate lines is increased in order to improve resolution of the liquid crystal display device, as shown in FIG. 12, the terminals GLa of the gate lines GL are alternately formed to be opposed to each other so as to ensure a space between the respective gate line terminals. The gate line terminals GLa are exposed by forming an opening in the gate insulating film 3 and the projection insulating film 7, respectively.

Also, an overcoat insulating film (not shown) coating the thin-film transistors 2 and the data lines DL is formed on the surface of the above-mentioned TFT panel, and an orientation treatment is provided on its surface.

The active matrix liquid crystal display device is manufactured by bonding the above TFT panel is bonded to an opposing panel (not shown) through a frame-like sealing material enclosing the display area A, and sealing liquid crystal between both panels. The opposing panel is structured by that an opposite electrode (transparent electrode) is formed on a transparent substrate and an orientation treatment is provided thereon. The substrate 1 is a large-sized substrate from which can obtain a plurality of TFT panels. After manufacturing each TFT panel formed on the substrate 1 or after assembling the liquid crystal display device, the TFT panel assembly is separated into individual TFT panels by cutting the substrate 1 along a cutting line B shown by a one-dotted line in the figure.

Moreover, in the active matrix liquid crystal device, a storage capacitor is formed in the above TFT panel to correspond to the respective pixel electrodes 6 in order to reduce a variation of a potential held by the pixel electrodes during a non-selection period.

In FIG. 16, CL denotes a capacitor line constituting the above storage capacitor. The capacitor line CL is made of the same metal (Al, Al based-alloy, Ti, W, Mo, and the like) as that of the gate line GL, and is formed on the substrate 1. The capacitor line CL is formed to be parallel to the gate line GL, and opposed to one side peripheral portion of the respective pixel electrodes 6 arranged along the gate line GL.

The storage capacitor comprises the capacitor lines CL, pixel electrode 6, and gate insulating film 3 positioned therebetween. The storage capacitor stores an electrical charge applied to the pixel electrode 6 when the pixel electrode 6 is selected (when the thin-film transistor 2 is turned on). The potential of the pixel electrode 6 during the non-selection period is held by the storage capacitor.

Both ends of the capacitor line CL are led to the outside of display area A. The respective capacitor lines CL are connected in common at their both ends by earth lines EL. The earth lines EL are formed on the protection insulating film 7 to be parallel to the data lines DL, and connected to the end portion of the respective capacitor lines CL through a contact hole formed in the protection insulating film 7 and the gate insulating film 3. The earth lines EL are connected to a reference potential at their terminals ELa.

In the above-mentioned TFT panel, if there are defects, e.g., a pin hole, a crack, and the like, in the gate insulting films 3 and/or the protection insulating films 7, the gate lines GL and the source and drain electrodes are short-circuited at the thin-film transistor portion and layer short-circuit is generated between both lines at the crossing portion among the gate lines GL, the capacitor lines CL, and the data lines DL.

Due to this, according to the above TFT panel, the surfaces of the gate lines GL and the capacitor lines CL are oxidized, so that oxide films are formed on the surfaces of the gate lines GL and the capacitor lines CL. The surfaces of the gate lines GL and the capacitor lines CL are insulated by the oxide films, so that the generation of the layer short-circuits are prevented.

The TFT panel in which the oxide films are formed on the surfaces of the gate lines GL and the capacitor lines CL is manufactured by the following method.

First of all, a metal film, which is made of Al, an Al based-alloy containing Ti, Ta, and the like, Ta, W, Mo, and the like is formed on the substrate 1. The metal film is patterned, so that the gate lines GL and the capacitor lines CL, and oxide voltage-apply lines 8 are formed. The oxide voltage-apply lines 8 are formed on both sides (outside of cutting line B) of the portion to be used as a TFT panel, respectively. In this case, the respective gate lines GL are patterned to have a shape in which an extension is formed in the outer end of terminals GLa alternately formed to be opposed to each other. At the extension, right and left oxide voltage-apply lines 18 are alternately short-circuited. Also, the respective capacitor lines CL are patterned to have a shape in which one end portion is alternately extended to the opposite side. At the extended portion, right and left oxide voltage-apply lines 8 are alternately short-circuited.

Then, a voltage is applied to the gate lines GL and the capacitor lines CL from the oxide voltage-apply lines 8 and anodization is performed, thereby forming oxide films on the surfaces of the gate lines GL and the capacitor lines CL.

The anodization is performed as follows.

The substrate 1 is dipped in an electrolytic solution, and the gate lines GL and the capacitor lines CL are opposed to an opposed electrode (platinum electrode) in the electrolytic solution. These lines GL and CL are used as an anode and the opposed electrode is used as a cathode, and a voltage is applied between the electrodes. When the voltage is applied between the electrodes in the electrolytic solution, the chemical reaction takes place on the surfaces of the gate lines and capacity lines CL, and the surfaces are oxidized, so that the oxide films are formed on the surfaces of the liens GL and CL.

The anodization is performed in a state that a portion where the terminals GLa of the gate lines GL and the earth lines EL of the capacitor lines CL are respectively connected is covered with a resist mask. As a result, since the portion covered with the resist mask neither contacts the electrolytic solution nor is anodized, the gate line terminals GLa and the earth line connecting section of the capacitor lines CL are left as they are in a state that the surfaces thereof have conductivity.

Thereafter, the gate insulating film 3 is formed, and an i-type semiconductor layer and an n-type semiconductor layer, and source and drain electrodes are formed thereon, whereby the thin-film transistors 2 are formed by the well known method. Also, the pixel electrodes 6, data lines DL, and ground lines EL are formed, so that TFT panel is completed.

Under this state, the gate lines GL and the capacity lines CL are short-circuited to either right oxide voltage-apply line 8 or left oxide voltage-apply line 8 at their one end. However, the portion where the oxide voltage-apply line 8 is formed is separated from the TFT panel by cutting the substrate 1 along the cutting line B after the manufacture of the TFT panel or the assembly of the liquid crystal display device. At this time, the gate lines GL and the capacitor lines CL are cut and separated from the oxide voltage-apply lines 8.

According to the conventional TFT panel manufacturing method, since the anodization of the gate lines GL and the capacitor lines CL is performed by applying the voltage to the respective lines GL and CL from their one ends, if breaking of the capacitor lines CL occurs, the oxide film cannot be formed on the surface of the portion, which is beyond the broken portion of the capacitor line CL. As a result, layer short-circuit is often generated between the portion, which is beyond the broken portion of the capacitor line CL, and the data line DL.

The reason why the above problem occurs is as follows:

Although the voltage is applied to the portion between the end portion of the voltage-apply line of the capacitor line CL and the portion of the broken line when anodizing, no voltage can be applied to the portion, which is beyond the broken line. Due to this, the portion, which is beyond the broken line, cannot be anodized.

As mentioned above, if there are defects, e.g., a pin hole, a crack and the like in the gate insulating film and the protection insulating film, the data lines DL formed on the protection insulating film and the capacitor lines CL are short-circuited at the crossing portion with the portion, which is not covered with the oxide film of the capacitor line CL. As a result, the manufactured TFT panel becomes defective.

The breaking of the lines often occurs in not only the capacitor lines CL but also the gate lines GL. In this case, there can be formed a portion where the surface of the gate line GL is not anodized. Since the breaking of the gate lines GL results in a display detect of the liquid crystal display device, the TFT panel in which the gate lines are broken is regarded as a defective product regardless of the anodizing state of the gate lines GL.

In contrast, the capacitor liens CL are connected to the reference potential through the earth lines EL connected to both ends of the capacitor lines CL. Due to this, even if breaking of lines occurs in the capacitor lines CL, the electrical charges are stored to all storage capacitors structured between the capacitor lines CL and pixel electrodes 6 in a case that the number of the broken lines is one. Thereby, the potential during the non-selection period of all pixel electrodes 6 can be maintained.

However, according to the conventional manufacturing method, if breaking of lines occurs in the capacitor lines CL, the layer short-circuit is generated between the portion, which is beyond the broken portion of the capacitor line CL, and the data line DL. Due to this, even if no breaking of lines occurs in all gate liens GL, the manufactured TFT panel becomes a defective product having the layer short-circuit, and the manufacturing yield of TFT panel is decreased.

Moreover, the following problem existed in the conventional TFT panel manufacturing method.

That is, both gate lines GL and capacitor lines CL are short-circuited to the same oxide voltage-apply lines 8. Due to this, when the substrate 1 is cut along the cutting line B after the manufacture of the TFT panels and the oxide voltage-apply line forming portion is separated the gate lines GL and the capacitor lines CL are often short-circuited at the cut end of the substrate.

The above problem can be explained as follows.

When the substrate 1 is cut along the cutting line B, an extension is generated from the gate line GL and the cut end of the capacitor line CL. The extension is generated by drawing out the metallic film formed in the inside of the oxide film. Then, both lines GL and CL contact to each other and the extension of one line contacts the cut end surface of the other line. Due to this, these lines GL and CL are short-circuited.

SUMMARY OF THE INVENTION

A first object of the present invention is to provide a method for manufacturing a TFT panel having high manufacture yield in which an anodized insulating film can be formed on substantially an entire surface of a capacitor line even if breaking occurs in the capacitor 1, and a layer short-circuit between the capacitor line and the other conductor can be prevented.

A second object of the present invention is to provide a method for manufacturing a TFT panel having high manufacture yield in which a capacitor line is anodized and an insulating film made of an oxide film is formed on the surface of the anodized capacitor line, and a conductive short-circuit between the gate line and the capacitor line can be prevented.

In order to attain the first object, the present invention provides a method for manufacturing a TFT panel comprises a first step of forming gate lines, capacitor lines, and oxide voltage-apply lines on a substrate such that both ends of the capacitor line and the gate line are electrically connected to the oxide voltage-apply line; a second step of forming oxide film on at least the surface of the gate lines and the capacitor line by anodization; a third step of forming thin-film transistors, pixel electrodes each connected to the thin-film transistor, data lines, and earth lines for connecting the oxide voltage-apply line; and a fourth step of electrically separating the gate line and the capacitor line from the oxide voltage-apply line in a process after the second step of forming the oxide film.

According to the above manufacturing method, when the gate lines and the capacitor lines are anodized, a voltage is applied to the capacitor lines from their both ends. Due to this, even if breaking occurs in the capacitor lines, the voltage can be applied to the entire capacitor lines, and the oxide film can be formed on the entire surface of the capacitor lines.

Moreover, in order to attain the second object, the present invention provides a method for manufacturing a TFT panel comprises a first step of forming gate lines, a capacitor lines, and oxide voltage-apply lines on an insulating substrate such that the gate line is connected to the oxide voltage-apply line and the capacitor line is electrically connected to the oxide voltage-apply line; a second step of generating oxide films on at least the surface of the gate line and the capacitor line by anodization; a third step of forming thin-film transistors, pixel electrodes each connected to the thin-film transistor, data lines, earth lines for connecting the oxide voltage-apply line; and a fourth step of electrically separating the capacitor line, the gate line and the oxide voltage-apply line.

According to the above manufacturing method, only the gate line is electrically connected to the oxide voltage-apply line, and the capacitor line is connected to the gate line at its end portion. Thereby, a voltage is applied to the gate line from the oxide voltage-apply line and a voltage is also applied to the capacitor line from the gate line. The gate line and the capacitor line are anodized. After a gate line short-circuit section of the capacitor line is at least anodized, the gate line short is cut and separated. Due to this, when the substrate is cut along the cutting line, and oxide voltage-apply line forming portion is separated, only the gate is cut. Therefore, since an extension is formed in only the gate line, and the end portion of the capacitor line is not exposed to the cut portion of the substrate, the gate line and the capacitor line are not shorted at the cut end portion of the substrate.

Furthermore, in the manufacturing method of the present invention, both ends of the capacitor line may be connected to the gate line connected to the oxide voltage-apply line. In this case, the capacitor line and the gate line are electrically separated from each other in a process after the anodization process.

According to the manufacturing method, the anodized insulating film is uniformly formed on the capacitor line. Also, since the capacitor line is not formed between the gate line terminals, the layer short and conductive short-cirucit are not generated, and the manufacturing yield is considerably improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be explained with reference to drawings.

First Embodiment

Figure 1:
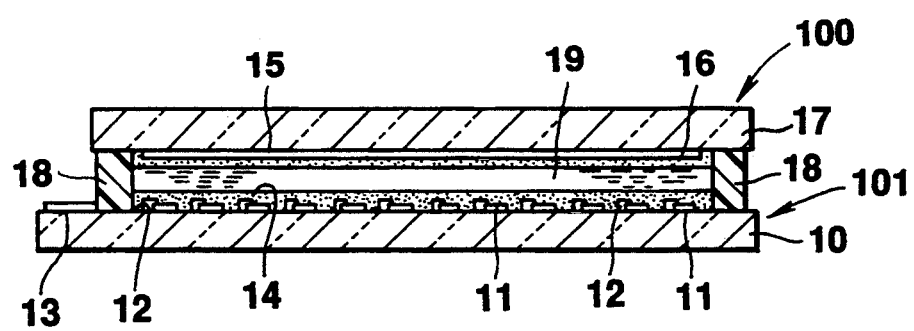
FIG. 1 is a cross sectional view showing an active matrix liquid crystal display device to which a TFT panel manufactured by the present invention is applied.

An active matrix crystal liquid display device in which a TFT panel manufactured by the present invention is used will be explained with reference to FIG. 1. FIG. 1 shows a cross section of the active matrix crystal liquid display device.

A TFT panel 101 comprises a transparent substrate 10 made of such as glass, a plurality of pixel electrodes 11 arranged in a matrix form, thin-film transistors (TFT) 12 arranged to correspond to the pixel electrodes 11, respectively, gate lines to which a gate electrodes of the TFT's are commonly connected and which are arranged along a row direction of the matrix, data lines to which drain electrodes of the TFT's are commonly connected and which are arranged along a column direction of the matrix, and a terminal 13 of the gate line.

In the TFT panel 101, an orientation film 14 is formed in a display area in which the pixel electrodes 11 are arranged. A transparent opposed substrate 17 on which a transparent opposed electrode 15 and an orientation film 16 are formed is arranged to be opposed to the TFT panel 101. Both substrates are bonded with a seal material 18, and a liquid crystal is sealed between these substrates, so that a liquid crystal display device 100 is constituted.

The TFT panel 101 is manufactured by the following steps:

First Step

Figure 2:
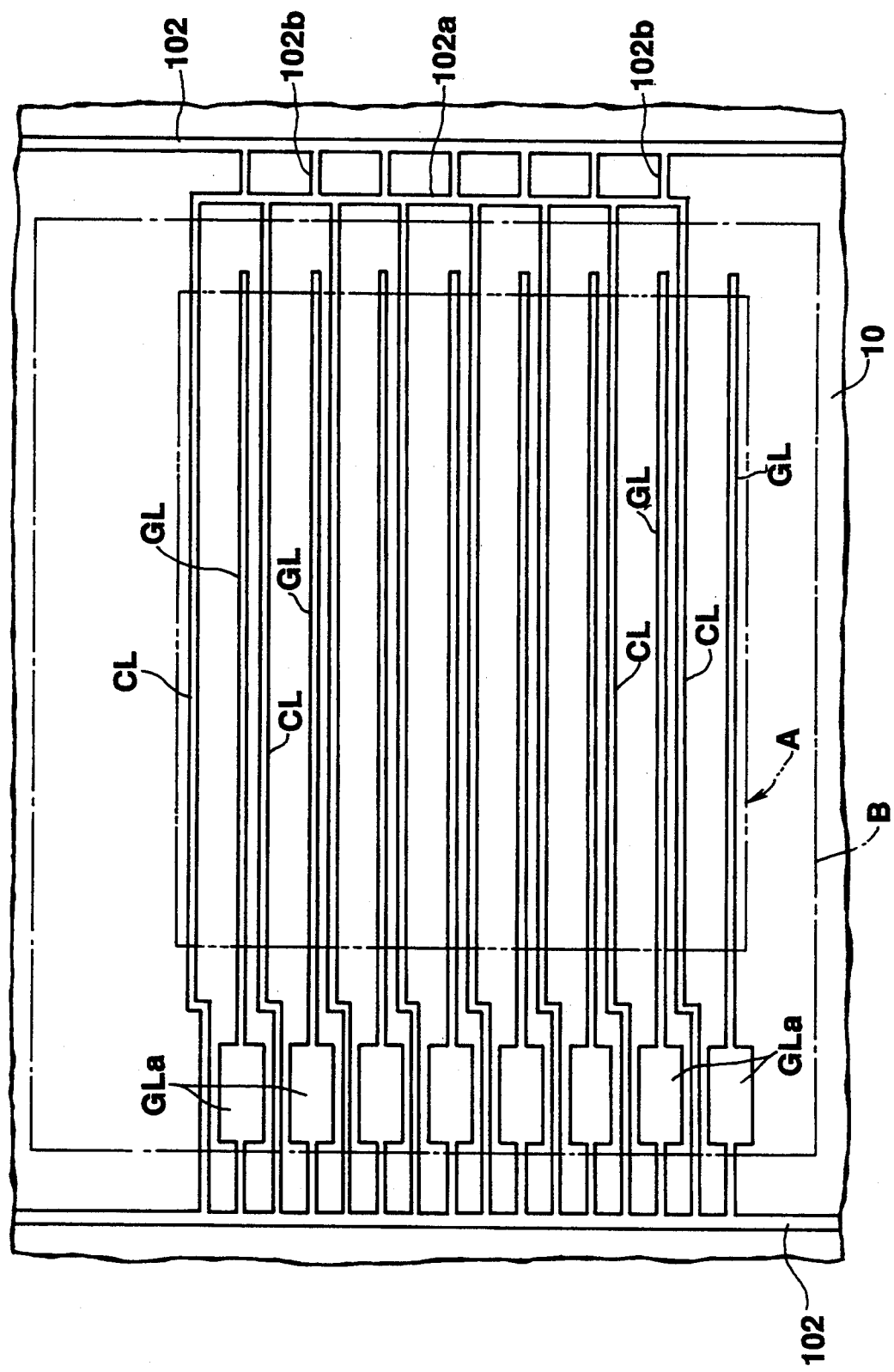
FIG. 2 is a plane view showing a transparent substrate of a manufacturing process of a first embodiment of the present invention.

As shown in FIG. 2, a metal film, which is made of Al, Al based-alloy containing Ti, Ta and the like, Ta, W, Mo, and the like, is formed on the substrate 10 made of glass. The metal film is patterned, so that the plurality of gate lines GL, and the plurality of capacitor lines CL, and a pair of right and left voltage-apply lines 102. The voltage-apply lines 102 are respectively formed in the outside of the portion (outside of cutting line B) where TFT panel is formed.

In this case, each of the gate lines GL is patterned in a to have a shape in which an extension extending to the outside of a cutting line B is formed in an outer end of its terminal GLa. Then, each of the gate lines GL is short-circuited to one voltage-apply line 102 (left side of the drawing) at the extended portion.

Also, each of the capacitor lines CL is patterned to have a shape in which both ends are respectively led to the outside of the cutting line B. One end of the respective lines CL is short-circuited to the other voltage-apply line 102 (right side of the drawing). The other end of the respective lines CL is extended between the adjacent gate line terminals GLa and short-circuited to said one voltage-apply line 102 shorting the gate lines GL. In this embodiment, a conductive line 102a connected to the right side voltage-apply line 102 through a plurality of short terminal lines 102b, which is short-circuited to one end of the respective capacitor lines CL, and the respective capacitor lines CL are connected to the conductive line 102a.

Second Step

Resist masks are formed on the terminal GLa of the gate lines GL and the connecting portion of the earth lines EL, which are respectively connected to both ends of the capacitor lines CL in a later step, to cover these portions. Under this state, a voltage is applied to the gate lines GL and capacitor lines CL from the pair of the voltage-apply lines 102, so that anodization is performed to form oxide films on the surfaces of the gate lines GL and the capacitor lines CL.

The anodization is performed as follows.

The substrate 10 is dipped in an electrolytic solution, and the gate lines GL and the capacitor lines CL are opposed to an opposed electrode (platinum electrode) in the electrolytic solution. These lines GL and CL are used as an anode and the opposed electrode is used as a cathode, and a voltage for oxidization is applied between these electrodes. The application of the voltage is performed by use of a clip-shape connector in the end portion of the voltage-apply lines 102. If the voltage is applied to the voltage-apply lines 102, the voltage is applied to the respective gate lines GL and the capacitor lines CL from the voltage-applied lines 102.

If the voltage is applied between these electrodes in the electrolytic solution, the chemical reaction takes place on the surfaces of the gate lines and capacity lines CL, which are used as anodes, and these surfaces are oxidized, so that oxide films are formed on these surfaces. The oxide films are formed on only the portions which are not covered with the resist masks. Then, the portions covered with the resist masks (and portions, which do not contact the electrolytic solution), that is, the gate line terminal GLa and the earth line connecting portion of the capacitor line CL are left as they are in a state that the surfaces thereof have conductivity. At this time, the surface of the portion of the voltage-apply line 102, which is dipped in the electrolytic solution, is also oxidized.

In this case, the capacitor lines CL are electrically connected to the right and left voltage-apply lines 102 at their both ends. Due to this, even if there is breaking of lines in any capacitor lines CL, the voltage is applied to the entire capacitor lines CL if the number of breaking of lines is one for one capacitor line. Therefore, the oxide film can be formed on the entire surface of any capacitor line CL having a broken line.

Third Step

Figure 3:
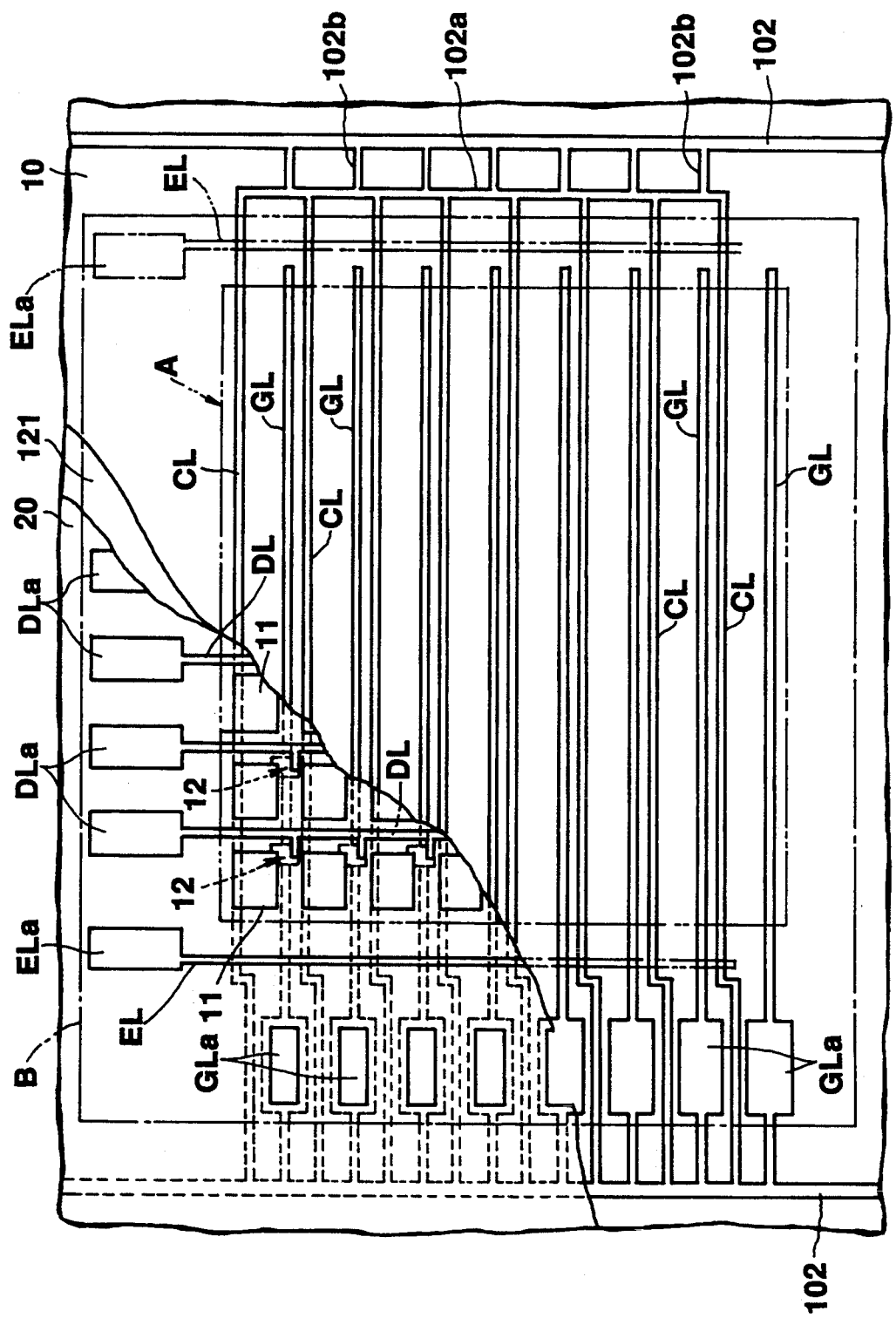
FIG. 3 is a plane view showing the TFT panel manufactured by the method of the first embodiment.

As shown in FIG. 3, the thin-film transistors 12, the pixel electrodes 11, data lines DL, and earth lines EL connecting the respective capacitor lines CL in common at the both end portions are formed, so that a TFT panel is completed.

Figure 4:
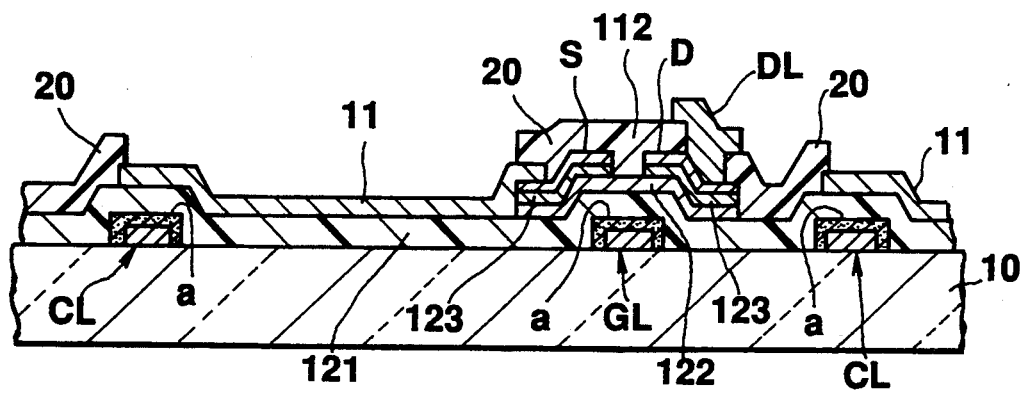
FIG. 4 is a cross sectional view showing a TFT and a pixel electrode portion of the TFT panel of FIG. 3.
Figure 5:
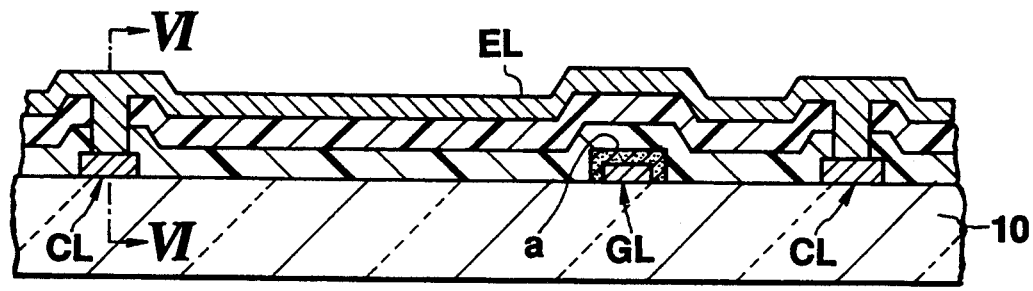
FIG. 5 is a cross sectional view of a common connecting section of a capacitor line in the TFT panel shown in FIG. 3.
Figure 6:
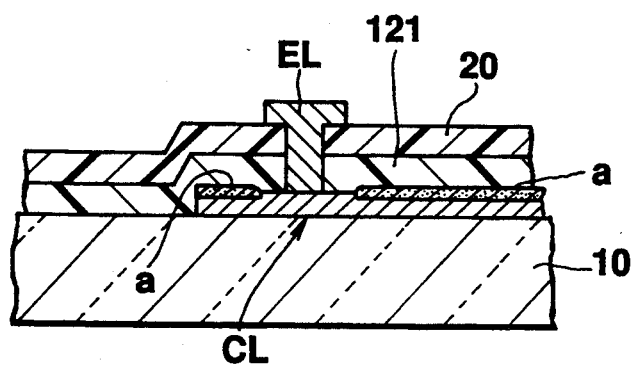
FIG. 6 is a cross sectional view taken along line VI—VI of FIG. 5.

FIG. 4 is a cross sectional view showing the thin-film transistor and the pixel electrode of the completed TFT panel. FIGS. 5 and 6 are cross sectional views sowing a common connecting portion of the capacitor lines of the completed TFT panel. In FIGS. 4 to 6, a denotes an oxide films formed on the surface of the gate lines CL and that of the capacitor lines CL by the above anodization.

The thin-film transistor 12 has an inverse stagger structure. That is, according to the structure of the thin-film transistor 12, the gate line GL formed on the substrate 10 is used as a gate electrode, a gate insulating film 121, an i-type semiconductor layer 122, an n-type semiconductor layer 123, and source and drain electrodes S and D are sequentially formed thereon.

The thin-film transistor 12 is manufactured as follows:

The gate insulating film 121 made of SiN, the i-type semiconductor layer 122 made of a—Si (amolphous silicon), the n-type semiconductor layer 123 made of a—Si to which n-type impurities are doped, and a source- and drain-metal film made of Cr, Al based-alloy are sequentially formed on the substrate 10 on which the gate lines GL and the capacitor lines CL have been formed and their surfaces have been anodized. These films and layers are patterned in the outline of the transistor element area. Thereafter, the source- and drain-metal film is separated at the portion corresponding to the channel area of the i-type semiconductor 122, so that the source and drain electrodes S and D are formed. Also, the portion of the n-type semiconductor layer 123 positioned between the source and drain electrodes S and D is removed.

The pixel electrode 11 is formed as follows:

A transparent conductive film made of such as ITO is formed on the gate insulating film (transparent film) 121, and the transparent conductive film is patterned. One end of the pixel electrode 11 is layered on the source electrode S of the thin-film transistor 12, and thus connected to the source electrode S. Moreover, the peripheral portion of the other end of the pixel electrode 11 is opposed to the capacitor line CL, so that the storage capacitor is formed in the portion.

Also, a protection insulating film 20 made of SiN is formed on the thin-film transistor 12. An opening through which the pixel electrode 11 is exposed and a contact hole through which the data line connecting portion of the drain electrode D is exposed are formed. Moreover, in the protection insulating film 20 and the gate insulating film 121 under the film 20, there are formed a contact hole through which the earth line connecting portion of the capacitor line CL is exposed and an opening through which the gate line terminal GLa is exposed.

The data lines DL and the earth lines EL connecting the respective capacitor lines CL in common are formed on the protection insulating film 20. The data line DL is connected to the drain electrode D through the contact hole formed in the protection insulating film 20, and the earth line EL is connected to the capacitor line CL through the contact hole formed in the protection insulating film 20 and the gate insulating film 121.

The data lines DL and the earth lines EL are formed by forming a metal film made of Al or Al alloy on the protection insulating film 20 and patterning the metal film. In this case, since the surface of the earth line connecting portion of the capacitor line CL is not oxidized, the earth line EL can be electrically connected to the the capacitor line CL through the contact hole.

According to the above-manufactured TFT panel 101, the respective gate lines GL are still electrically connected to one voltage-apply line 102 at the end portion in the side where the terminal is formed. However, if the substrate 10 is cut along the cutting line B after the manufacture of the TFT panel or the assembly of the liquid crystal display device, and portions where the right and left voltage-apply lines 102 are formed are separated from the TFT panel, the gate lines GL can be individually separated. Moreover, if the portions where the voltage-apply lines 102 are formed are separated from the TFT panel, the respective capacitor lines CL are separated from the right and left voltage-apply lines 102.

More specifically, in the manufacturing method of the TFT panel 101, the voltage is applied to the capacitor lines CL from the both ends when anodizing the gate lines GL and the capacitor lines CL. According to the manufacturing method, even if there is breaking in any capacitor lines CL, the voltage is applied to the entire capacitor lines, and the oxide films a can be formed on the entire surfaces.

Therefore, according to the above manufacturing method, even if defects, e.g., a pin hole, a crack, and the like, are generated in the gate insulting film 121 and the protection insulating film 20, the portion between the capacitor line CL and the data line DL formed on the protection insulating film 20 can be insulated with the oxide film a covering the surface of the capacitor line CL. Thus, it is possible to prevent the generation of the layer short-circuit in the crossing section of the capacitor line CL and the data line DL.

In a case that two or more portions are broken in one capacitor line CL, only both end portions, which are extended from the broken portions of the capacitor line CL, are anodized and the inner side portion, which is positioned between from the broken portions, is not oxidized. In this portion, there is a case that the layer short-circuit is generated between the data lines DL and the capacitor lines CL. However, it is a rare case that two or more portions are broken in one capacitor line CL.

Due to this, the manufactured TFT panel becomes defective is only when the breaking of line occurs in the gate lines GL in many cases. Therefore, according to the above-manufactured method, the manufacturing yield of the TFT panel can be largely improved as compared with the conventional manufacturing method.

In the above first embodiment, the terminals GLa of all gate lines GL are formed on the same side. The present invention can be applied to the manufacture of the TFT panel in which the terminals GLa of the respective gate lines GL are alternately formed on the opposite sides.

Second Embodiment

Figure 7:
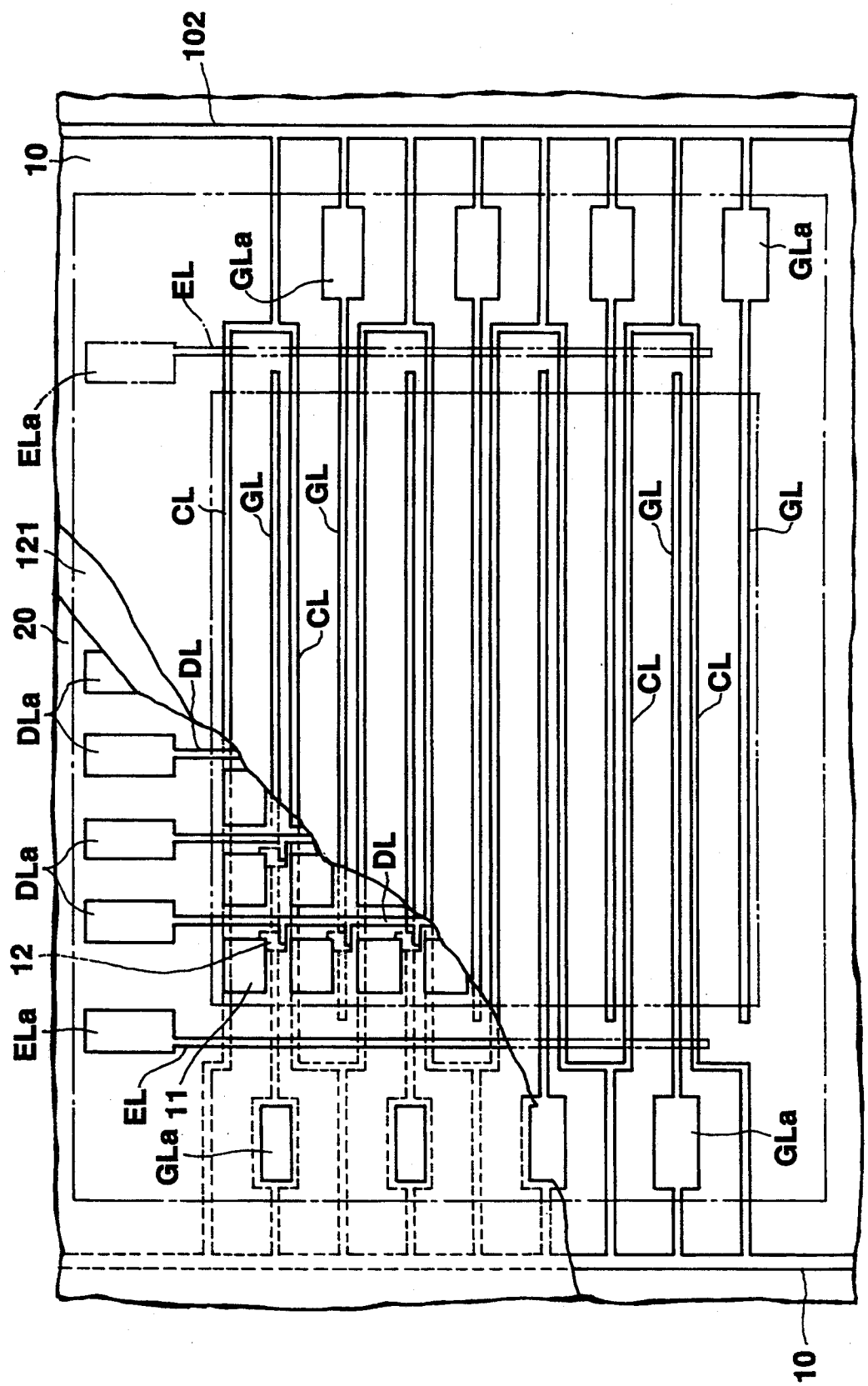
FIG. 7 is a plane view showing a TFT panel manufactured by the method of a second embodiment of the present invention.

FIG. 7 shows a second embodiment of the present invention. This embodiment preferably is applied to the manufacture of the TFT panel having a large number of gate lines in order to improve resolution of the liquid crystal display device. According to this TFT panel, in order to ensure the distance between the respective gate line terminals, the terminals GLa of the respective gate lines GL are alternately formed on the opposite sides. It is noted that the same reference numerals are added to the same members as those of the first embodiment, and the explanation is omitted.

According to this embodiment, the respective gate lines GL whose terminals GLa are alternately formed on the opposite sides are alternately connected to the right and left voltage-apply lines 102 at the end portion of the terminal forming side. Then, both ends of the respective capacitor lines CL are electrically connected to the right and left voltage-apply lines 102, respectively. Under this state, the gate lines GL and the capacitor lines CL are anodized. After anodizing these lines GL and CL, the TFT panel is completed in the same manner as the first embodiment.

According to the above embodiment, both right and left voltage-apply lines 102 are used as one line. Moreover, adjacent capacitor lines CL are alternately shorted at their one end or other end, all capacitor lines CL are connected in a zigzag line, and the short-circuit sections of the adjacent capacitor lines are connected to the voltage-apply lines 102, so that both ends of the respective capacitor lines CL are connected to the right and left voltage-apply lines 102.

Third Embodiment

In the above first and second embodiments, both ends of the capacitor lines CL are directly connected to the right and left voltage-apply lines 102. In manufacturing the TFT panel in which the terminals GLa of the respective gate lines GL are alternately formed on the opposite sides, both ends of the capacitor lines CL may be respectively connected to the gate lines GL and connected to the right and left voltage-apply lines 102 through the gate lines GL. In this case, the short-circuit section between the capacitor lines CL and the gate lines GL may be separated after at least anodization.

FIGS. 8 to 14 show a third embodiment. In this embodiment, both ends of each capacitor line CL are connected to the right and left voltage-apply lines 102 by the gate lines GL, and anodization is performed, the TFT panel manufactured as the following steps.

First Step

Figure 8:
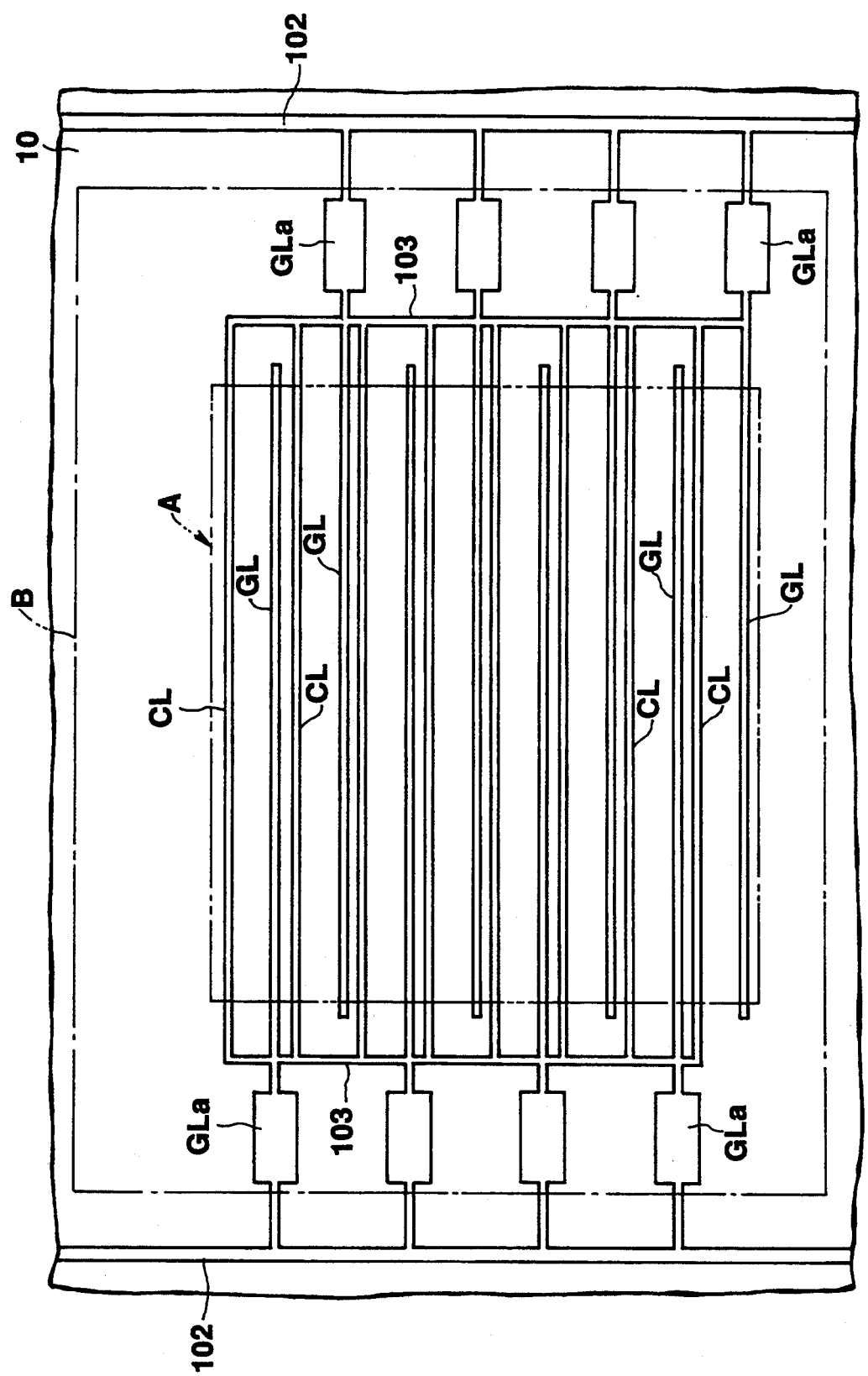
FIG. 8 is a plane view showing a transparent substrate of a manufacturing process of a third embodiment of the present invention.

As shown in FIG. 8, a metal film is formed on a substrate 10, and the metal film is patterned, so that a plurality of gate lines GL of which terminals GLa are alternately formed on the opposite sides, a plurality of capacitor lines CL, and a pair of right and left voltage-apply lines 102 are formed.

In this case, each of the gate lines GL is patterned to have a shape in which an extension extending to the outside of the cutting line B is formed in the outer end of the terminal GLa. The respective gate lines GL are alternately shorted to the right and left voltage-apply lines 102 at the extension.

Each of the capacitor lines CL is patterned to have a shape in which both ends of the capacitor line CL are respectively connected to the gate line GL at the portion between the side peripheral portion of display area A and each of the gate line terminals GLa arranged on this side. In this embodiment, a short-circuit line 103, which is perpendicular to the gate line GL and the capacitor line CL, respectively, is formed at the portion between the one side peripheral portion of display area A and each of the gate line terminals GLa arranged on this side (the gate line GL and the capacitor line CL are integrally formed of the metal film), and both ends of each of the capacitor lines CL is connected to each of the gate lines GL through the short-circuit line 103.

Second Step

Then, a voltage is applied to the gate line GL from the voltage-apply line 102 and also applied to the capacitor line CL from the gate line GL, thereby performing anodization thereof. As a result, oxide films are formed on the surface of the gate line GL and that of the capacitor line CL.

Figure 9:
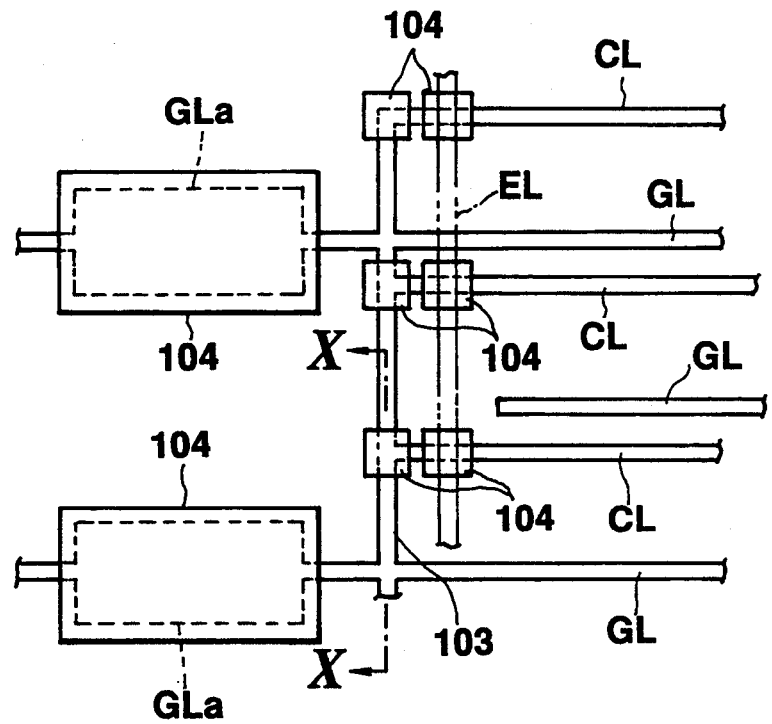
FIG. 9 is a partially enlarged plane view showing one process of a method for anodizing a gate line and a capacitor line according to the third embodiment of the present invention.
Figure 10A:
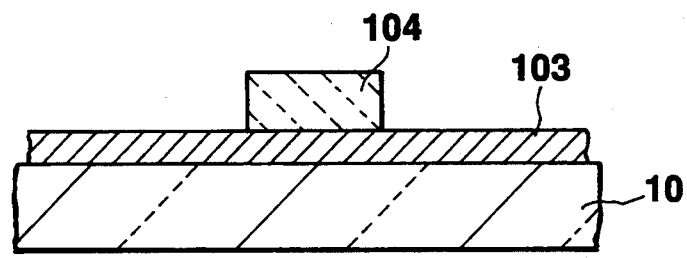
FIGS. 10A and 10B are enlarged cross sectional views each showing an anodization process, and taken along line X—X of FIG. 9.

The above anodization is performed as follows:

As shown in FIGS. 9 and 10A, resist masks 104 are formed on the terminal GLa of the gate line GL, earth line connecting section of the capacitor line CL, and the capacitor line short-circuit section of the short-circuit line 103 for converting them.

Then, the substrate 10 is dipped in an electrolytic solution, and the surface of the gate line GL and that of the capacitor line GL are anodized by the same manner as the first embodiment. In this embodiment, the voltage is applied to each of the gate lines GL from the right and left voltage-apply lines 102, and the voltage is further applied to each of the capacitor lines CL from the gate line GL through the short-circuit line 103.

Figure 10B:
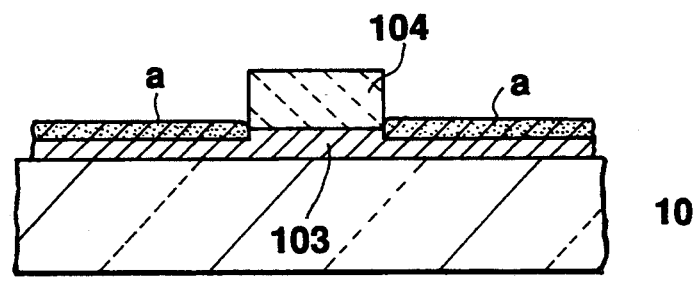

As a result of anodization, oxide films a are formed on the surface of the gate line GL and that of the capacitor line CL as shown in FIG. 10B. The oxide films a are formed on only the portions which are not covered with the resist masks 104. Then, portions, which do not contact the electrolytic solution, that is, the gate line terminal GLa, the earth line connecting section of the capacitor line CL, and the capacitor line short-circuit section of the short-circuit section 103 are left as they are in a state that the surfaces thereof have conductivity.

Third Step

Figure 11:
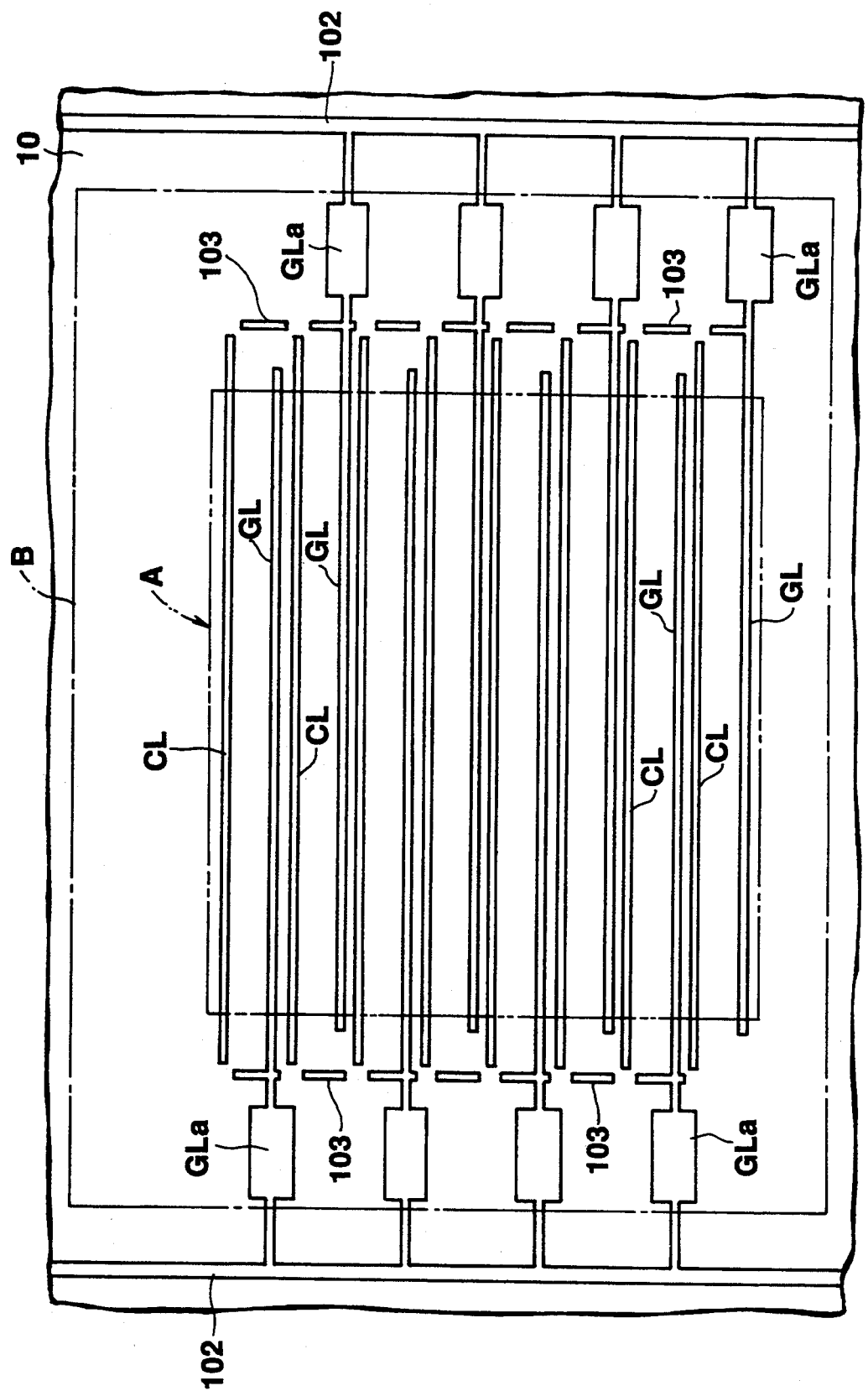
FIG. 11 is a plane view showing a state that the capacitor line and the gate line are separated from each other according to the third embodiment.

As shown in FIG. 11, the short-circuit section between the capacitor lines CL and the gate line GL (in this embodiment, the capacitor line short-circuit section of the short-circuit section 103) is cut and separated.

Figure 12:
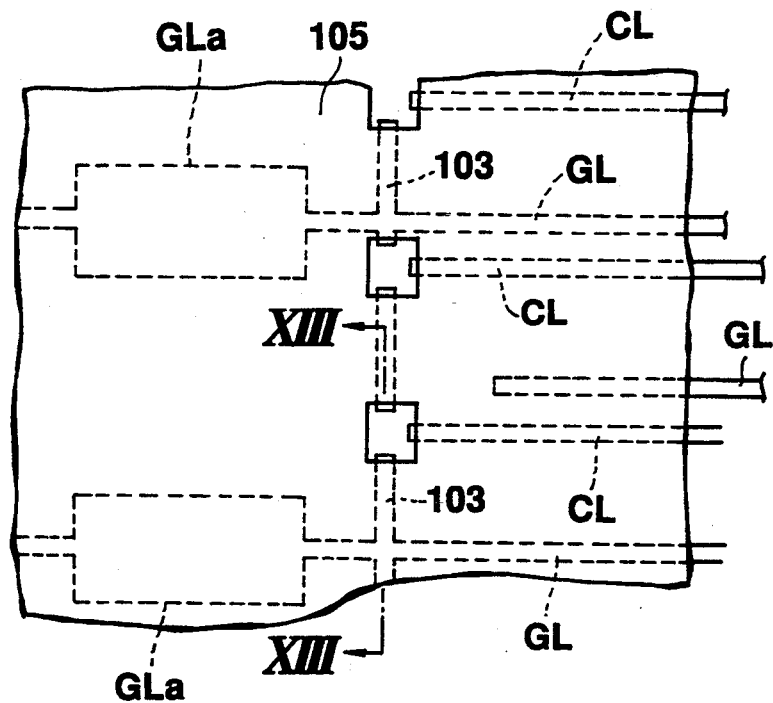
FIG. 12 a partially enlarged plane view showing a process for separating the capacitor line and the gate line of FIG. 11 from each other.
Figure 13:
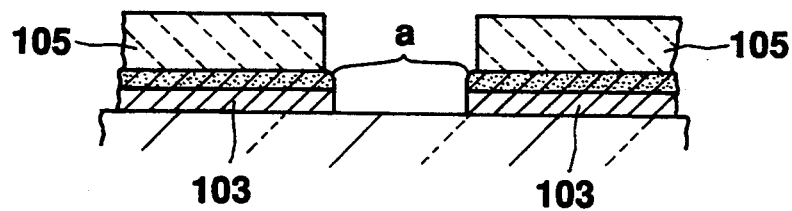
FIG. 13 is an enlarged cross sectional view taken along line XIII—XIII of FIG. 12.

The cut and separation of the short-circuit section between each of the capacitor lines CL and the gate line GL is performed by the following method:

After peeling the resist mask 104 formed when anodizing, as shown in FIGS. 12 and 13, resist masks 105 covering other portions excepting the capacitor line short-circuit section of the short-circuit line 103 are formed. Under this state, in the capacitor line short-circuit section of the short-circuit section 103, an area whose surface is not oxidized is etched and removed.

In etching this area, since the oxide films a on the surface of the capacitor lines CL other than this area and the surface of the short-circuit line 103 are used as an etching mask, the accuracy of the shape of the resist mask 105 may be roughly set to some extent.

Fourth Step

Figure 14:
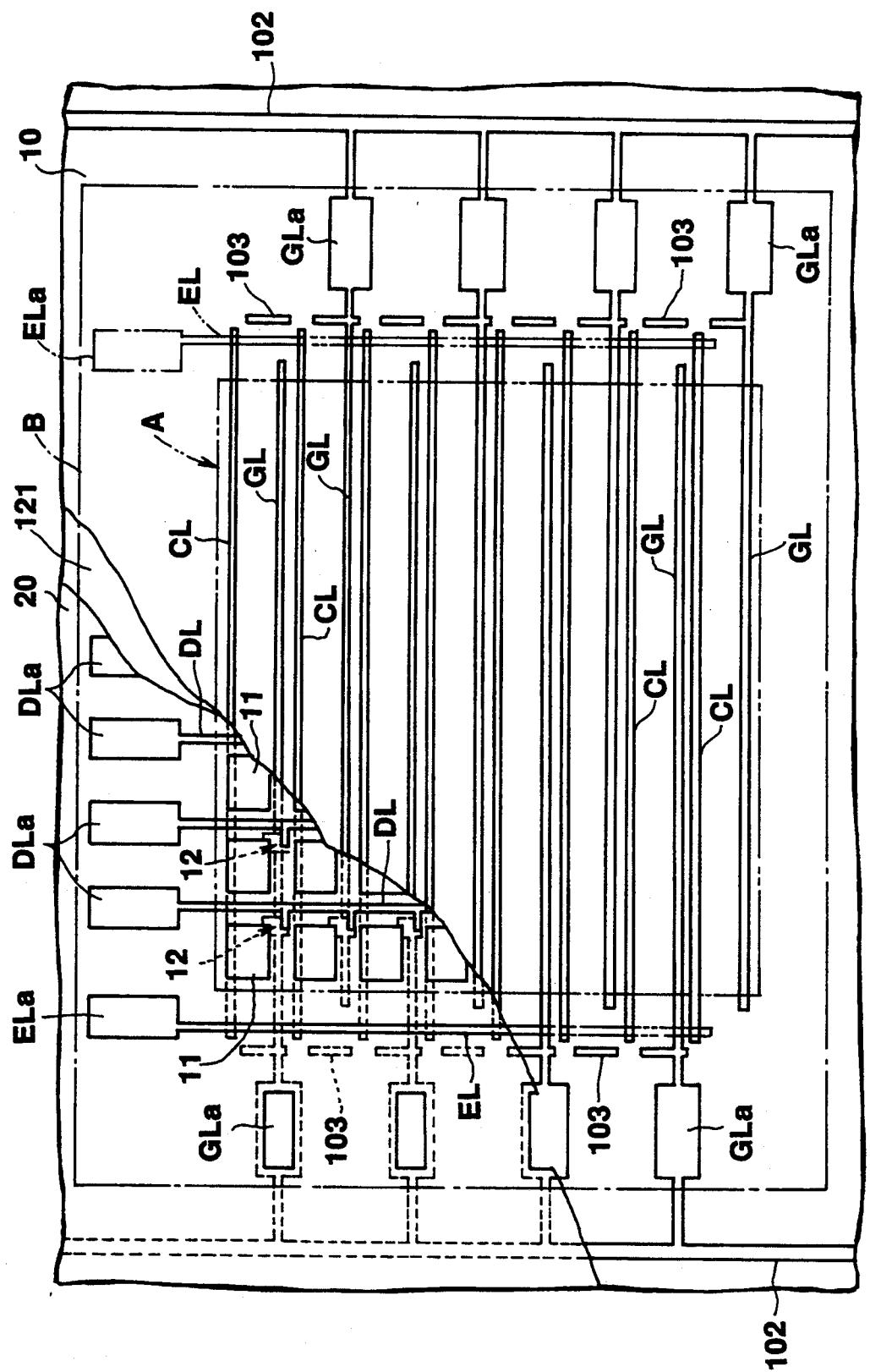
FIG. 14 is a plane view showing a TFT panel manufactured by the method of the third embodiment.

As shown in FIG. 14, the TFT panel is completed by forming thin-film transistors 12, pixel electrodes 11, data lines DL, and earth lines EL for connecting both ends of each of the capacitor lines CL in common.

The portions of the substrate 10 where the voltage-apply lines 102 are formed are separated from the TFT panel by cutting the substrate 10 along the cutting line B after manufacturing the TFT panel or assembling the liquid crystal display device.

In this embodiment, regardless of whether or not the capacitor lines CL are broken, a voltage is applied to the entire capacitor lines, and the oxide film a can be formed on the entire surface of the capacitor lines. Thereby, generation of layer short-circuit between the capacitor lines CL and the data lines DL can be prevented, and manufacture yield of the TFT panel can be improved.

In this embodiment, before the process of forming the thin-film transistors 12 (before forming the gate insulating film), the gate line short-circuit section of the capacitor line CL (in this embodiment, the capacitor line short-circuit section of the short-circuit line 103) is cut and separated. However, the cut and separation of the gate line short-circuit section may be performed any time after at least the anodization is performed.

Figure 15A:
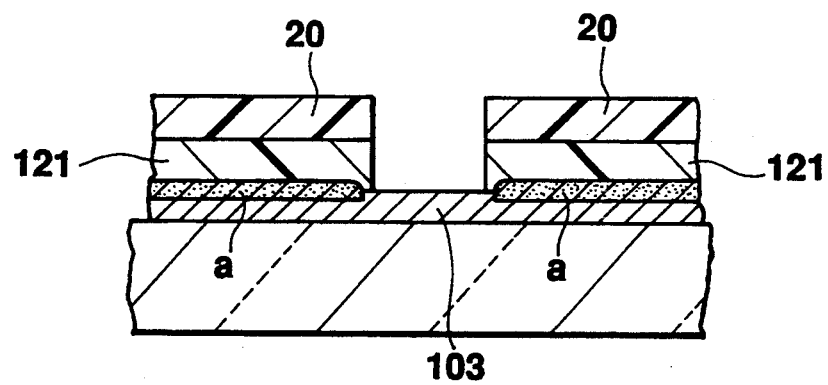
FIGS. 15A, 15B, and 15C are step-views showing the other methods for separating the capacitor line and the gate line of the third embodiment from each other, respectively.
Figure 15B:
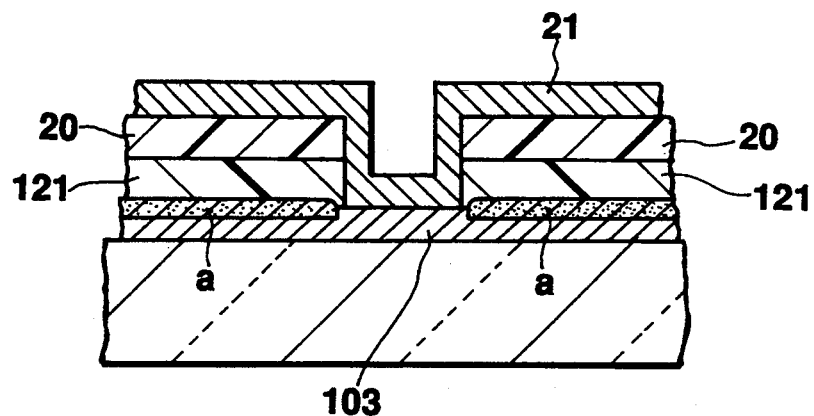
Figure 15C:
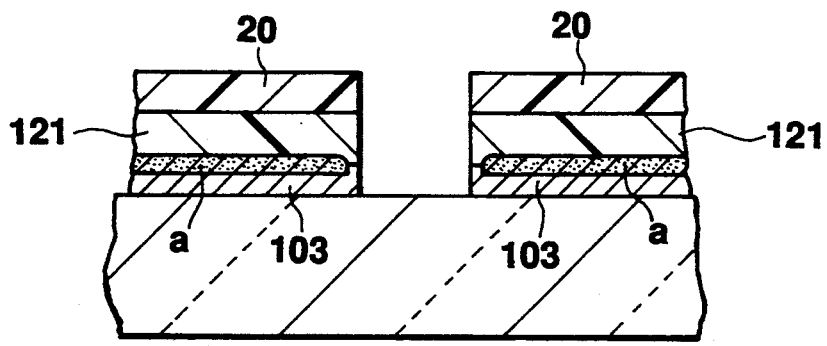
Figure 16:
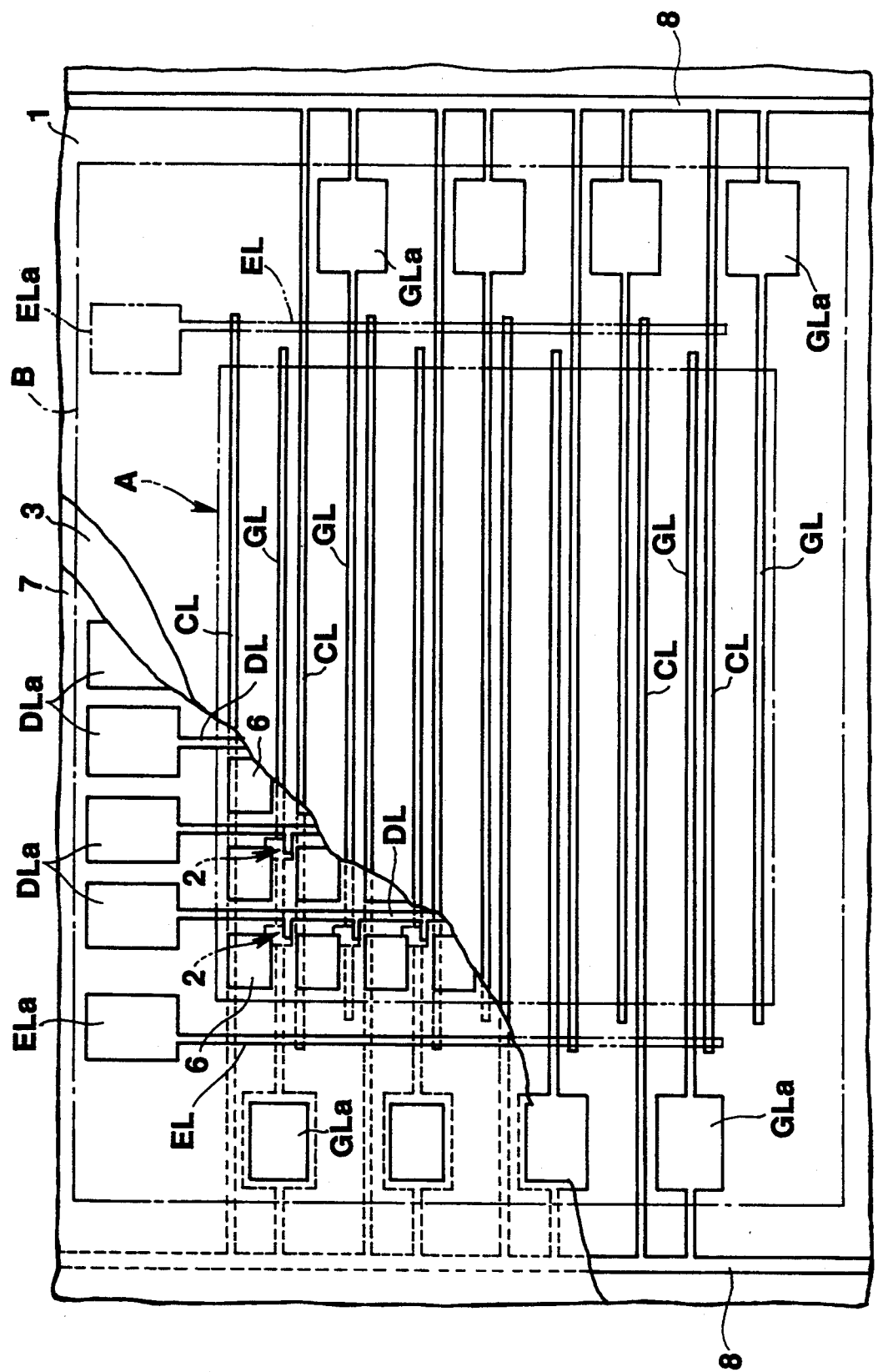
FIG. 16 is a plane view showing a TFT panel manufactured by a conventional manufacturing method.

FIGS. 15A to 15C show other methods for separating the gate line short-circuit section of the capacitor line CL (in these figures, the capacitor line short-circuit section of the short-circuit line 103). In these examples, the gate line short-circuit section of the capacitor line CL is cut and separated when the data line DL and the earth line EL for connecting the respective capacitor lines CL in common are formed. The separation is performed as follows:

First, as shown in FIG. 15A, after the protection insulating film 20 is formed, an opening through which the capacitor line short-circuit section of the short-circuit section 103 is exposed is formed in the protection insulating film 20 and the gate insulating film 121 under the film 20. The opening is formed in the protection insulating film 20 and the gate insulating film 121 at the same time when a contact hole through which the data line connecting section of the drain electrode D is exposed and a contact hole through which the earth line connecting section of the capacitor line CL is exposed are formed.

As shown in FIG. 15B, a metal film 21, which constitutes the data lines DL and the earth lines EL, is formed on the protection insulating film 20. Thereafter, when the metal film 21 is patterned to form the data lines DL and earth lines EL, the metal film 21 in the opening and the capacitor line short-circuit section of the short-circuit line 103 are etched and removed. Then, as shown in FIG. 15C, the gate line short-circuit section of the capacitor line CL is cut and separated.

As mentioned above, if the gate line short-circuit section of the capacitor line CL is cut and separated when the the data line DL and the earth line EL are formed, the gate line short-circuit section can be cut and separated by use of the process of forming the data line DL and the earth line EL. Therefore, the TFT panel can be efficiently manufactured.

In the above third embodiment, the capacitor line CL is cut and separated at the short-circuit section with the short-circuit line 103. However, the separation of the capacitor line CL from the gate line GL may be performed by cutting the portion between the gate line short-circuit section of the short-circuit line 103 and the capacitor line short-circuit section or removing the entire short-circuit line 103.

In the above first to third embodiments, anodization of the gate line GL and the capacitor line CL is performed by the method in which the chemical reaction is taken place in the electrolytic solution. However, anodization may be performed by plasma oxidation in which a chemical reaction is taken place in a gas atmosphere.

According to the third embodiment, only the gate line is electrically connected to the oxide-apply line, and both ends of the capacitor line are connected to the gate line. Thereby, the voltage is applied to the gate line from the oxide-apply line and the voltage is also applied to the capacity line from the gate line. Thereby, the gate line and the capacitor line are anodized. Then, the gate line short-circuit section of the capacitor line is cut and separated after at least being anodized. Therefore, it is only the gate line to be cut when the substrate is cut along the cutting line and the oxide-apply line forming section is separated. Moreover, since the end portion of the capacitor line is not exposed to the cut end of the substrate, the gate line and the capacitor line are not shorted at the cut end of the substrate.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a TFT panel comprising:
    a first step of forming gate lines, capacitor lines, and two oxide voltage-apply lines on a substrate such that the gate lines are connected to the oxide voltage-apply lines and both ends of each of the capacitor lines are connected to the gate lines;
    a second step of applying a voltage to the oxide voltage-apply lines for forming oxide films on surfaces of the gate lines and the capacitor lines by anodization;
    a third step of forming thin-film transistors, pixel electrodes connected to the thin-film transistors, data lines connected to the thin-film transistors, and a ground line connected to the capacitor lines; and
    a fourth step of separating the gate lines from the oxide voltage-apply lines and separating the capacitor lines from the gate lines in a process after the second step of forming the oxide films;
    wherein:
    the first step includes a process of forming the oxide voltage-apply lines on the substrate with the gate line arranged between the oxide voltage-apply lines and connected to the oxide voltage-apply lines, and the capacitor lines arranged between the oxide voltage apply lines and connected to the oxide voltage-apply lines;
    the second step includes a process of covering contact points between the capacitor lines and the gate lines with a resist, and a process of anodizing the exposed surfaces of the capacitor lines and the gate lines; and
    the fourth step includes a process of separating the capacitor lines from the gate lines by etching non-anodized portions of the contact points between the capacitor lines and the gate lines.

2. A method for manufacturing a TFT panel comprising:
    a first step of forming gate lines, capacitor lines, and two oxide voltage-apply lines on an insulating substrate such that the gate lines are connected to the oxide voltage-apply lines, and the capacitor lines are connected to the gate lines;
    a second step of applying a voltage to the oxide voltage-apply lines for generating oxide films on at least the surfaces of the gate lines and the capacitor lines by anodization;
    a third step of forming thin-film transistors including a gate insulating film and a protecting film, pixel electrodes connected to the thin-film transistors, data lines connected to the thin-film transistors, and a ground line connected to the capacitor lines; and
    a fourth step of separating the capacitor lines, the gate lines and the oxide voltage-apply lines from each other in a step after the second step and;

wherein:
the second step includes a process of covering contact points between the capacitor lines and the gate lines with a resist, and a process of anodizing the exposed surfaces of the capacitor lines and the gate lines; and the fourth step includes a process of removing gate insulating films formed on the contact points between the capacitor lines and the gate lines and the protecting films formed on the gate insulating films, and a process of separating the capacitor lines from the gate lines by removing non-anodized portions of the contact points at the same time with etching a conductive film formed after the process of removing the gate insulating films and the protecting films.

3. The method for manufacturing the TFT panel according to claim 2, wherein:
the first step includes forming the two oxide voltage-apply lines on the insulating substrate, such that each of the gate lines are arranged between the oxide voltage-apply lines;

each of the gate lines has an end which is connected to the oxide voltage-apply lines;

each of the capacitor lines is arranged between the two oxide voltage-apply lines; and each of the capacitor lines has an end which is connected to a respective one or two of the gate lines.

4. The method for manufacturing the TFT panel according to claim 2, wherein the fourth step is carried out between the second and third steps.

5. The method for manufacturing the TFT panel according to claim 2, wherein the fourth step is carried out at the same time with a process of etching the earth line of the third step.

6. The method for manufacturing the TFT panel according to claim 2, wherein the fourth step includes a process of separating the oxide voltage-apply lines from the gate lines.

7. A method for manufacturing a TFT panel comprising:
a first step of forming two oxide voltage-apply lines, gate lines provided between the two oxide voltage-apply lines and each gate line including a terminal which is wider than other portions thereof, capacitor lines provided between the two oxide voltage-apply lines on an insulating substrate such that each of the gate lines is connected to a corresponding one of the oxide voltage-apply lines, and each of the capacitor lines is connected to the gate lines at both ends of the capacitor lines;

a second step of applying a voltage to the oxide voltage-apply lines and anodizing surfaces of the gate lines and the capacitor lines;

a third step of forming thin-film transistors, pixel electrodes connected to the thin-film transistors, data lines connected to the thin-film transistors, and a ground line connected to the capacitor lines; and a fourth step of separating the capacitor lines, the gate lines and the oxide voltage-apply lines from one another.

8. The method for manufacturing the TFT panel according to claim 7, wherein said gate lines have first gate lines connected to one of the two oxide voltage-apply lines, and second gate lines connected to the other of the two oxide voltage-apply lines.

* * * * *